United States Patent [19]
Mohsen

[11] 4,010,484
[45] Mar. 1, 1977

[54] CHARGE INJECTION INPUT NETWORK FOR SEMICONDUCTOR CHARGE TRANSFER DEVICE

[75] Inventor: Amr Mohamed Mohsen, North Plainfield, N.J.

[73] Assignee: Bell Telephone Laboratories, Incorporated, Murray Hill, N.J.

[22] Filed: Aug. 16, 1974

[21] Appl. No.: 498,052

[52] U.S. Cl. .............................. 357/24; 307/221 D; 307/304; 357/68
[51] Int. Cl.$^2$ ........................................ H01L 29/78
[58] Field of Search ........... 357/24, 68; 307/221 C, 307/221 D, 304

[56] References Cited

UNITED STATES PATENTS

| | | | |
|---|---|---|---|
| 3,760,202 | 9/1973 | Kosonocky | 357/24 |
| 3,845,295 | 10/1974 | Williams et al. | 357/24 |
| 3,881,117 | 4/1975 | Tompsett | 357/24 |

OTHER PUBLICATIONS

M. Tompsett et al., "Charge Coupled 8–Bit Shift Register," Appl. Phys. Lett., vol. 17, No. 3, Aug. 1, 1970, pp. 111-115.
J. Carnes et al., "Measurements of Noise in Charge–Coupled Devices," RCA Review, Dec. 1973, pp. 553-565.
R. Krambeck et al., "A Doped Surface Two–Phase CCD," Bell System Tech. J., vol. 51, No. 8, Oct. 1972, pp. 1849-1866.
W. Engeller et al., "A Mem. Sys. Based on Surf.-CH. Trans.," IEEE J of S–S Ckts., vol. SC–6, No. 5, Oct. 1971, pp. 306-313.
R. Baertsch et al., "The Pluses and Minuses of CH. Trans. Dev.," Electronics, Dec. 6, 1971, pp. 86-90.
W. Kosonocky et al., "Charge–Coupled Digital Circuits," IEEE, J. of S–S Ckts., vol. SC–6, No. 5, Oct. 1971, pp. 314-322.
J. Tartamella, "Control–CH. Dev. Shift Register," IBM Tech. Discl. Bull., vol. 15, No. 5, Oct. 1972, p. 1461.
A. Mohsen et al., "Push–Clocks; A New Appr. to CCD Clocking," App. Phys. Lett., vol. 22, No. 4, Feb. 15, 1973, pp. 172-175.
W. Kosonocky et al., "Two–Phase CCDs w. Overlapping Poly-Si and Al Gates," RCA Review, vol. 34, Mar. 1973, pp. 164-201.
W. Kosonocky, "Two Phase CCDs" RCA Technical Notes, TN 931, Apr. 26, 1973, pp. 1, 2.

Primary Examiner—Michael J. Lynch
Assistant Examiner—Joseph E. Clawson, Jr.
Attorney, Agent, or Firm—D. Caplan

[57] ABSTRACT

A semiconductor charge transfer device (CTD) has an input network which includes an added gate region held at constant voltage, the added gate region being located between an input semiconductor charge injection region (input diode) and a signal gate region. In this way the amount of signal charge transferred into the CTD is less sensitive to unavoidable noise in the clock voltages which are applied to electrodes associated with the bulk of the CTD for the purpose of shifting the signal charge therethrough; and the linearity of the ratio of injected charge to signal voltage is also improved.

8 Claims, 4 Drawing Figures

CHARGE INJECTION INPUT NETWORK FOR SEMICONDUCTOR CHARGE TRANSFER DEVICE

FIELD OF THE INVENTION

This invention relates to the field of semiconductor apparatus and, more particularly, to semiconductor shift register apparatus operating by means of sequential electrical charge transfers in a semiconductor medium.

BACKGROUND OF THE INVENTION

In the prior art, shift-register operation has been achieved in semiconductor devices by means of the electrically controlled shifting of localized accumulations of charges (charge packets) in a semiconductor medium. Such charge packets are controllably translated through the semiconductor by means of applied clock voltage pulses which transfer electrical charges from one storage site to the next in the semiconductor device. Thus, such a semiconductor shift-register is, in effect, a type of charge transfer device (CTD). These devices are useful in such applications as delay lines and optical imaging apparatus.

Charge transfer devices in the semiconductor art fall into two main categories, the so-called "charge-coupled device" (CCD) and the integrated circuit versions of the bucket-brigade device (BBD). In either category, a spatially periodic electrode metallization pattern on a major surface of a semiconductor body coated with electrically insulating oxide defines a sequence of integrated MOS (metal-oxide-semiconductor) type capacitor regions, serving as transfer sites, so that localized electrical charge accumulations (or portions thereof) in the semiconductor, originate in response to an input signal. These charge packets can then be shifted through the semiconductor sequentially between adjacent MOS capacitor regions under the influence of a sequence of (clock) electrical voltage pulses applied to the electrodes. The charge packets, in response to a signal, are initially injected at the input end of a chain of such MOS capacitor regions, in accordance with a stream of digital or analog signal information, for example, in the form of signal-controlled injected charges into a first transfer site of the CTD at the appropriate moments of time relative to the clock voltage pulse sequence. As known in the art, the clock voltage pulse sequence can be three-phase, two-phase, or single-phase, in connection with such CTD's as described for example in, respectively: 49 *Bell System Technical Journal* (April 1970), pp. 587–593; U.S. Pat. No. 3,651,349, issued to D. Kahng et al. on Mar. 21, 1972; and U.S. Pat. No. 3,796,932, issued to G. F. Amelio et al. on Mar. 12, 1974.

It should be understood, of course, that ordinarily in present-day semiconductor charge transfer devices, the semiconductor medium is silicon and the oxide is silicon dioxide; however, other suitable semiconductor-insulator combinations may be used in general. Thus, in particular, the term "oxide" (and hence "MOS") in connection with CTD's can refer to any such suitable insulator.

In application Ser. No. 395,388, filed in the name of M. F. Tompsett on Sept. 10, 1973, U.S. Pat. No. 3,881,117 an input circuit for injecting charges into a semiconductor transfer device was described in which the charge packet input to the semiconductor charge transfer device could be made substantially independent of the surface characteristics of the semiconductor. In that patent application, an input charge injection circuit was disclosed in which signal-independent input charges from a charge source region (input diode) were periodically transferred to the first transfer site of the CTD, and signal-dependent charges were subsequently transferred from this first CTD transfer site back to the charge source. Thereby, the net input (signal) charge packet in the first transfer site, which is then subsequently transferred to the bulk of the CTD, was substantially insensitive to the variable semiconductor surface channel characteristics of the surface of the semiconductor in the neighborhood of the input diode. However, the net input charge of a given packet, representative of the instantaneous signal, was still somewhat degraded by noise from the clock voltages applied to the first transfer site. Also, the linearity of the ratio of net input signal charge to signal voltage, while substantially improved over prior art, was not as good as desired in certain commercial applications for analog signal processing such as analog delay lines, transversal filters, time compressors and expanders.

SUMMARY OF THE INVENTION

An input network, for controlling input charge packets for transfer through the bulk of a semiconductor CTD, includes an input diode region separated from a signal-controlled input gate region ("signal gate") by a reference-voltage-controlled gate region at the surface of the semiconductor medium in which the CTD is fabricated. The reference-voltage-controlled gate region ("reference gate") is a region at the semiconductor surface, the electrical potential of which is controlled by a constant reference voltage source. This reference voltage source is connected to a reference voltage electrode located above the reference gate region. Thereby, the electrical potential of the reference gate region is maintained at a substantially constant fiducial level. (This fiducial level may, however, vary in common mode signal input applications involving input signals formed by the difference of potential on a pair of electrodes.)

In operation, the input diode region is periodically electrically pulsed by a voltage pulse which is sufficient to inject and shift electronic charges through the reference gate region into the signal gate region. The reference gate region is advantageously maintained at a voltage potential sufficient for producing a potential barrier against return of charge back to the input diode region when the signal gate region is maintained at sufficient voltage potential in accordance with signal. The quantity of charge, which thereby is injected into, and collected by, the signal gate region for further shifting through the bulk of the CTD, is a linear function of (i.e., linearly proportional to) the difference between the signal voltage and the reference voltage. In this way also, this quantity of charge is substantially independent of the unavoidably relatively high electrical noise level in the clock pulse voltages being supplied to the bulk of the CTD.

In a specific embodiment of the invention, an N-channel CTD, utilizing the shifting of electrons (negatively charged) in a P-type conductivity monocrystalline semiconductor body, is built with an input diode region of $N^+$ (strongly N-type) semiconductor. The input diode region is periodically pulsed with a negative-going voltage. The consequently injected electron charges from the input diode are sequentially shifted through an array of MOS capacitor regions (transfer sites) in the bulk of the CTD by means of a suitable three-phase clock voltage pulse sequence, as known in the art. However, between the input diode and the first of these MOS transfer sites of the CTD array is located, in sequence, a reference-voltage-controlled MOS capacitor region (reference gate) and a signal-controlled input MOS capacitor region ("signal gate"). Specifically, each of these MOS capacitor regions is formed by an electrode overlying an oxide coating on the surface of the semi-conductor body. A reference voltage is constantly applied to the electrode overlying the reference gate region, whereas the signal voltage is applied to the electrode overlying the signal gate region. The negative-going pulse applied to the input diode is advantageously sufficient to make the potential of the input diode region at least slightly more negative than the reference gate region, but otherwise voltage potential of the input diode region is advantageously substantially more positive than the voltage of reference gate region. The voltage potential of the input signal region should advantageously vary (according to signal) between the voltage potential of the reference voltage region (for zero analog signal) and one-half the excess (for full analog signal) of the (typically mutually equal) positive-going clock voltage pulse level over the voltage potential of the reference voltage region. In this way, the signal charges injected into the CTD, for subsequent shifting therethrough, will be substantially linearly proportional to the signal voltage as is desirable in the use of a CTD for handling analog input signals.

BRIEF DESCRIPTION OF DRAWING

This invention and its other objects and features will be understood with greater clarity from the following detailed description taken in conjunction with the drawings in which.

Figure 1:
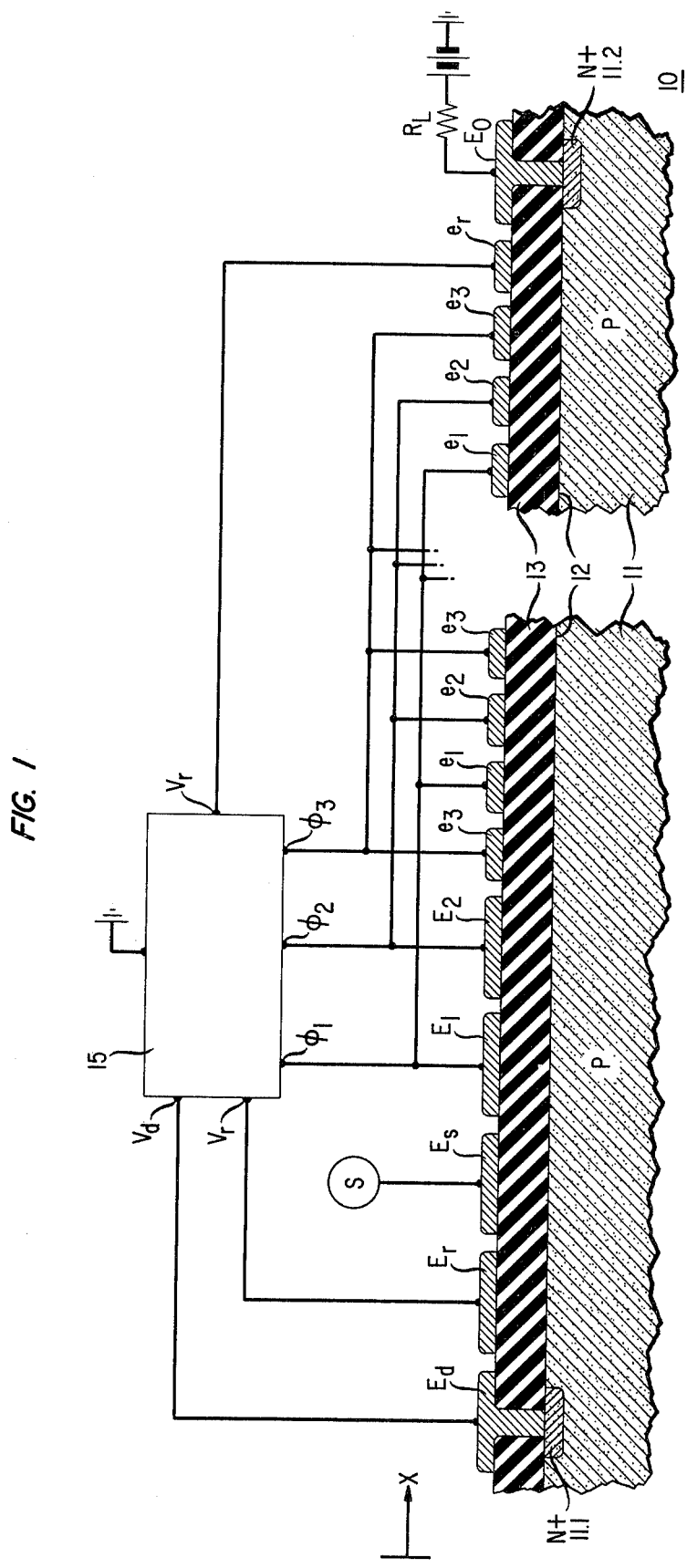
FIG. 1 is a cross-section diagram of three-phase semiconductor charge transfer device apparatus with an input charge injection network, in accordance with a specific embodiment of the invention.
Figure 3:
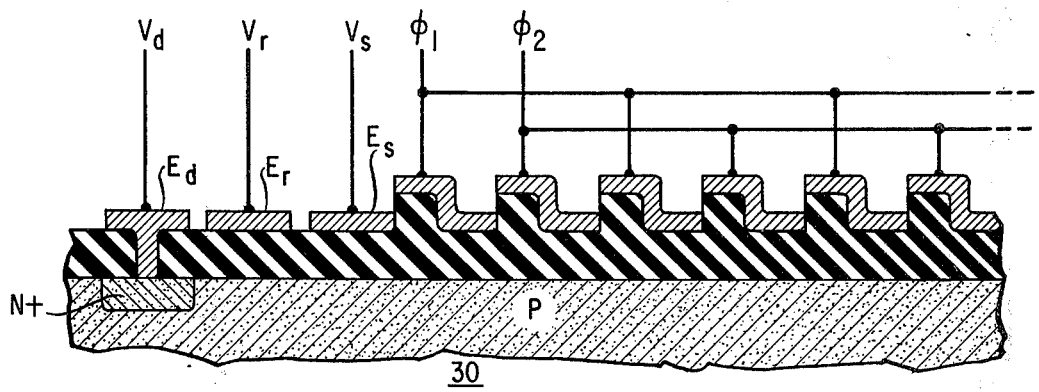
FIG. 3 is a cross-section diagram of a portion of two-phase semiconductor charge transfer device apparatus with an input charge injection network, in accordance with another embodiment of the invention.
Figure 4:
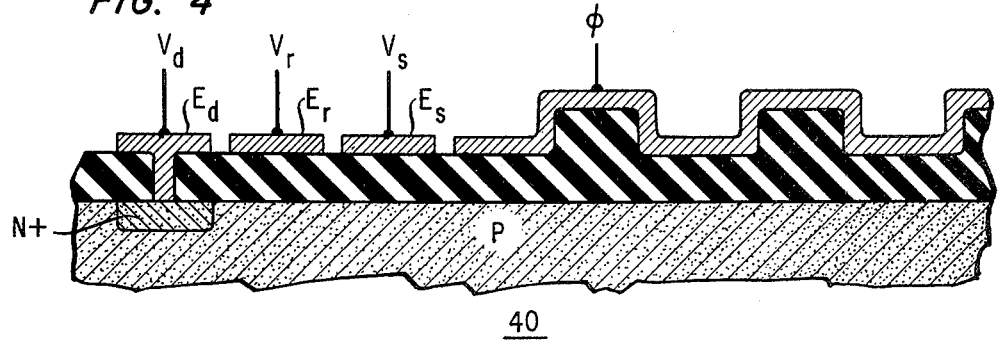
FIG. 4 is a cross-section diagram of a portion of single-phase semicondutor charge transfer device apparatus with an input charge injection network, in accordance with yet another embodiment of the invention.

Only for the sake of clarity, none of the drawings is to scale, except that the electrode widths in the horizontal direction are according to the same relative scale on each of FIGS. 1, 3 and 4.

DETAILED DESCRIPTION

As shown in FIG. 1, a three-phase semiconductor charge transfer device 10 includes a single crystal P-type conductivity semiconductive silicon medium 11. On the surface 12 of this medium 11 is disposed an insulating oxide layer 13, typically about 1500 A thick silicon dioxide which has been thermally grown at typically about 1100° C. A pair of N$^+$ regions 11.1 and 11.2 are formed at the surface 13 to serve respectively as an input diode region 11.1 and an output diode region 11.2. Typically, the diode regions 11.1 and 11.2 contain excess significant donor impurities to the extent of between about $10^{18}$ per cm$^3$ and $10^{21}$ per cm$^3$, typically about $10^{20}$ per cm$^3$; whereas the bulk of the silicon medium 11 contains excess significant acceptor impurities to the extent of between about $10^{14}$ per cm$^3$ and about $10^{16}$ per cm$^3$, typically about $5\times10^{14}$ per cm$^3$.

The oxide layer 13 contains a pair of apertures respectively for an ohmic contact electrode $E_d$, to furnish external electrical contact for the input diode region 11.1, and an ohmic contact electrode $E_o$, to furnish external electrical contact for the output diode region 11.2. Between these electrodes is located a sequence of electrodes $E_r$, $E_s$, $E_1$, $E_2$, $e_3$, $e_1$, $e_2$, $e_3$, . . . $e_1$, $e_2$, $e_3$, $e_r$. The electrodes denoted with E (capital letter) are advantageously at least about twice as wide in the x-direction (running in the direction from $E_d$ to $E_o$, parallel to surface 12 of medium 11 in the charge transfer propagation direction) as the mutually substantially equal widths of the electrodes denoted with e (lower case). Thereby, the input regions located beneath $E_s$ and $E_r$ are sufficiently wide to store sufficient charge even at maximum signal, for subsequent transfer. The lengths of these electrodes, however, perpendicular to the plane of the drawing (also parallel to surface 12 of the medium 11) are typically all equal. The widths of these latter (e-type) electrodes can be in the range of about 5 micron to 30 micron, typically about 10 micron. The electrodes are supplied with voltages by means of a voltage source 15 to which they are connected.

Figure 2:
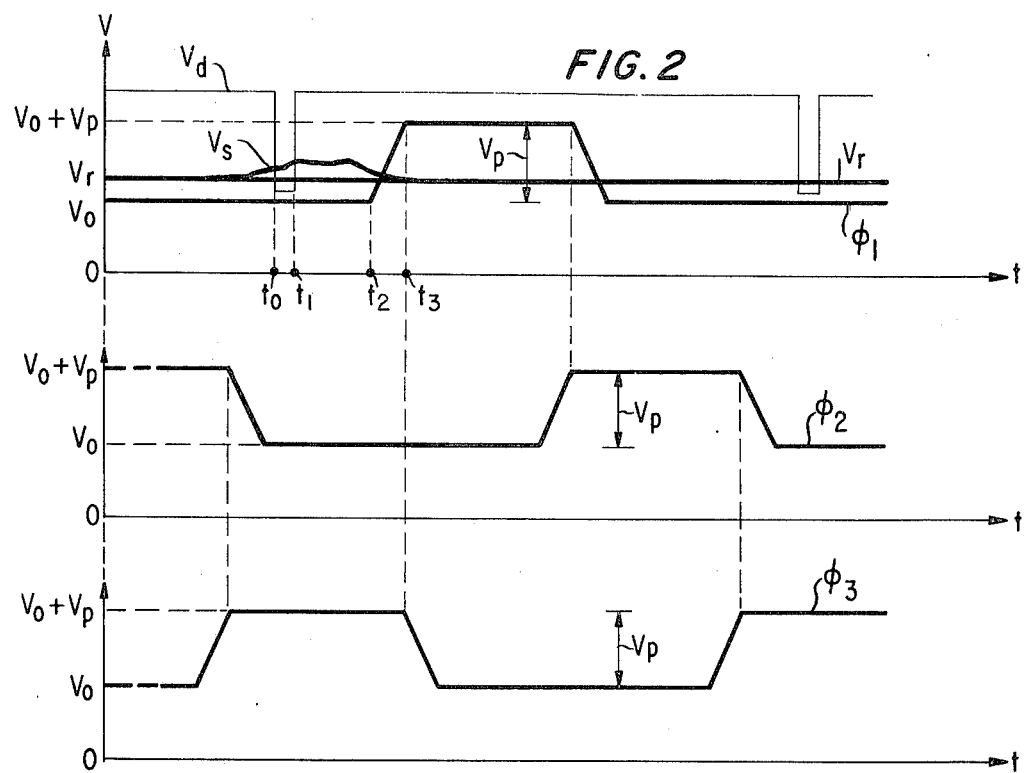
FIG. 2 is a plot of voltages vs. time, useful in describing the operation of the apparatus shown in FIG. 1.

In operation, the advantageously common voltage level $V_o$ (FIG. 2) of the clock pulse voltage phases ($\phi_1$, $\phi_2$ and $\phi_3$) is selected to be about 1 volt; while the common voltage pulse height $V_p$ of these clock pulses advantageously is about 15 volt. The reference voltage level $V_r$ is typically about 5 volt, and this same voltage $V_r$ can be applied both to electrode $E_r$ on the input side of the CTD 10 and to electrode $e_r$ on the output side thereof. The voltage level for the input diode voltage (applied to $E_d$) is selected advantageously such that, only during a pulse phase thereof ($t_o t_l$) during the active (on) phase ($V_o + V_p$) of clock pulse $\phi_3$, the input diode voltage is between $V_r$ and $V_o$, and is at least slightly larger than $V_o + V_p$ otherwise. The pulse phase of the input diode thus occurs while the clock phases $\phi_1$ and $\phi_2$ are both quiescent (off) (i.e., of level equal to $V_o$). Typically, the input diode voltage during the time interval $t_o t_l$, the input pulse phase, is about 3 volt, whereas the input diode level otherwise (outside time interval $t_o t_l$) is about 17 volt. However, this latter voltage of 17 volt can be reduced so long as it is maintained higher than $V_r$. The signal voltage applied to electrode $E_s$ advantageously is adjusted so that it ranges between $V_r$ and $V_r + \frac{1}{2}(V_o + V_p - V_r)$ depending upon signal, that is, a zero analog signal is represented by $V_r$ and a maximum analog signal by $\frac{1}{2}(V_o + V_p + V_r)$. Thereby, the reference voltage $V_r$ applied to the electrode $E_r$ is sufficient to produce a fiducial potential in the reference gate region (underneath electrode $E_r$) which produces a voltage barrier at the reference gate region-signal region interface. This voltage barrier is sufficient to prevent return of desired signal charge back to the input region. Thus, the reference voltage $V_r$ also serves to contain electrical charge within the signal region in accordance with signal voltage $V_s$. In this way, the injected charges (per cycle of clock phase pulses) from the input diode region 11.1 to the bulk of the CTD have been measured to be a faithful analog representation of the (average) signal voltage during the time interval $t_o, t_i$, with a non-linearity (error) level of less than about 40 dB with respect to signal.

It should be understood that the electrodes of the CTD 10 should advantageously all be fabricated so as to overlap mutually next neighboring electrodes, with suitable mutual insulation as known in the art. Thereby, substantially complete charge transfer is ensured from one corresponding site to another in the semiconductor medium underneath these electrodes.

It should also be understood that the various voltages $V_o$, $V_p$, $V_r$, and the clock voltages $\phi_1$, $\phi_2$, $\phi_3$ are electrical surface potentials produced in the semiconductor medium 11 just underneath the corresponding electrodes to which the voltages are applied from the voltage source 15, and that the corresponding voltages supplied by the source 15 to the electrodes are somewhat greater than these potentials (due to the voltage drops across the insulator 13).

As indicated in FIGS. 3 and 4, respectively, this invention is also applicable to two-phase and single-phase CTDs, as known in the art. In the two-phase device 30 (FIG. 3), the voltage clock phases $\phi_1$ and $\phi_2$ produce voltage potentials in the semiconductor medium which vary between $V_o$, in the left-hand portion of a transfer site during the passive (off) phase of $\phi_1$ in the clock pulse sequence, and $(V_o + V_p)$, in the right-hand portion of a transfer site during the active (on) phase of $\phi_1$. In the single-phase device 40 (FIG. 4), the voltage potentials vary between $V_o$ and $(V_o + V_p)$, again in the left-hand vs. right-hand portion of a site, passive vs. active phase of the clock pulse sequence. For the details of the bulk portion of the single-phase device 40 (i.e., the portion to the right-hand side of the electrode $E_s$), reference may be made to the description of FIG. 13 in the aforementioned U.S. Pat. No. 3,796,932.

In certain applications (common mode signal input) where the desired signal input information is in the form of the difference $(V_s - V_r)$, then it is advantageous to have both electrodes $E_s$ and $E_r$ located on the same oxide level of the layer 13. In case these electrodes are separated apart, then an auxiliary electrode (not shown) mutually insulated from, and straddling over, $E_s$ and $E_r$ should be added, in order to provide smooth potential barriers, and hence smooth charge transfers, in the semiconductor in the region underneath $E_s$ and $E_r$.

It is believed that the advantages of this invention over prior art with respect to relatively low noise level and linearity of analog charge packets with signal voltage are due to at least two factors. One factor is the relatively smooth vertical edges of the potential barriers of the site in the semiconductor medium associated with the electrode $E_s$. Another factor is the relative insensitivity of the amount of charge collected into an input charge packet with respect to the unavoidable noise voltages in the clock pulse voltages applied to the bulk of the device, since the voltages supplied to both of the electrodes $E_r$ and $E_s$ (the only electrodes associated with the quantity of charge in the input charge packets) are independent of clock pulse voltages.

It should be understood that although the invention has been discussed in detail with reference to specific embodiments, various modifications can be made by a skilled worker without departing from the scope of the invention. For example, N-type (rather than P-type) semiconductor can be used for the bulk semiconductor medium 11, in conjunction with reversal of the polarities of the applied voltages, as well as with some possible modifications in the magnitude of the applied voltages depending upon the properties of the semiconductor medium as is well understood in the art. In addition, while only surface channel semiconductor devices have been discussed in detail, this invention is equally applicable to bulk channel devices, i.e., those in which charge transfer occurs in an entire but thin (about 1 micron) semiconductor layer of opposite conductivity type from the bulk semiconductor substrate. Finally, the electrodes can take the form of mutually insulated heavily impurity-doped polycrystalline silicon electrodes, as known in the art.

What is claimed is:
1. Apparatus including an input network for a charge transfer device medium which comprises:
   a. an input region in the medium for periodically injecting charge into the medium;
   b. a reference region contiguous to the input region;
   c. a signal region contiguous to the reference region and spatially followed by the bulk of the charge transfer device, the potential of the signal region being controlled by a signal, the signal region thereby collecting charges injected by the input region through the reference region in accordance with the signal for subsequent transfer of said charges as packets through the bulk of the charge transfer device, and the reference region serving as a constant reference potential region both for transfer of charges from the input region to the signal region and for containing said charges in the signal region after transfer into the signal region, said input region, reference region, and signal region located in a spatial sequence at the input end of the device;
   d. circuit means for applying voltages to an input electrode associated with and contacting the input region sufficient for periodically injecting charges into the medium during a time interval in each off phase of a clock pulse sequence of voltages applied to a first transfer electrode of the bulk of the charge transfer device, and for applying voltages to a reference electrode associated with and in proximity to the reference region sufficient to maintain said reference region at the reference potential $V_r$ which is constant in time, the electrodes associated with the signal region, the first transfer electrode and a next in sequence second transfer electrode of the bulk of the transfer device being all at least about twice as long in the charge transfer direction in the device as the other electrodes in the bulk of the charge transfer device, said other electrodes all being substantially of the same length in the charge transfer direction; and
   e. circuit means for applying voltages to an electrode associated with the signal region in accordance with the signal.

2. The device set forth in claim 1 in which the medium is an electrically semiconductive medium.

3. Apparatus in accordance with claim 2 in which the semiconductor is essentially silicon and the insulator is essentially silicon dioxide.

4. Apparatus according to claim 3 including circuit means for producing the clock pulse sequence of voltages, having on and off phases for transferring charge packets through the medium, sufficient to produce a surface potential in the medium underneath the first transfer electrode of a magnitude $V_o$ during the off phases and of a magnitude $V_o + V_p$ during the on phases; the reference potential $V_r$ being in the range between $V_o$ and $V_o + V_p$, and the voltage applied to the electrode of the input region being periodically in the range between $V_o$ and $V_r$ only during periodic predetermined time intervals within the off phases of said clock pulse sequence and being greater than $V_r$ otherwise.

5. The apparatus set forth in claim 4 in which the signal is adjusted such that the surface potential of the signal region varies within limits between $V_r$ and $\frac{1}{2}(V_r + V_o + V_p)$.

6. Apparatus in accordance with claim 1 in which the widths of the electrodes associated respectively with the reference region and the signal region and the widths of the first and second transfer electrodes and of the said other electrodes in a direction parallel to the surface of the semiconductor but perpendicular to the charge transfer direction are all substantially the same.

7. Apparatus according to claim 6 which further includes signal circuit means for controlling the surface potential of the signal region within the limits of $V_r$ and $(V_r + V_o + V_p)/2$, respectively, in accordance with a signal.

8. Semiconductor apparatus which includes an input network for a charge transfer device on a major surface of a semiconductor medium which comprises:
   a. an input surface region in the medium;
   b. a reference surface region in the medium spatially following the input region, said reference surface region having associated therewith a reference electrode in proximity thereto for controlling the surface potential of said reference surface region;
   c. a signal surface region in the medium spatially following the reference region, said signal surface region having associated therewith in proximity thereto a signal electrode for controlling the surface potential of said signal surface region;
   d. a first transfer surface region in the medium spatially following the signal region, said first transfer surface region having associated therewith in proximity thereto a first transfer surface region electrode for controlling the surface potential of said first transfer surface region, the electrodes associated with the said reference surface region, the signal region, the first transfer surface region, and a next in sequence second transfer electrode of the bulk of the transfer device are all at least about twice as long in the charge transfer direction in the device as the other electrodes in the bulk of the charge transfer device, said other electrodes all being substantially of the same length in the charge transfer direction, and the electrodes associated with said reference region, said signal region, said first transfer region, and said second transfer electrode and said other electrodes all being substantially of the same width in the direction parallel to the major surface of the medium perpendicular to the charge transfer direction;
   e. circuit means for maintaining the surface potential of the reference region at a voltage $V_r$ which is constant in time;
   f. circuit means for controlling the surface potential of the first transfer region in accordance with a predetermined sequence of on and off phases, such that the surface potential of the first transfer region is $V_o$ during the off phases and $V_o + V_p$ during the on phases, $V_r$ being in the range between $V_o$ and $V_o + V_p$; and
   g. circuit means for applying a charge injection voltage sequence to an input electrode in direct physical contact with the input region, such that the voltage applied to input electrode is in the range of between $V_o$ and $V_r$ only during periodic predetermined time intervals within the said off phases and greater than $V_r$ otherwise, whereby electrical charges are injected during said time intervals by said input region through the reference region into the signal region for further transfer by the first transfer region in accordance with the surface potential of the signal region.

* * * * *